(12) United States Patent
Mauk

(10) Patent No.: US 7,211,521 B2
(45) Date of Patent: May 1, 2007

(54) CAPPING LAYER FOR CRYSTALLIZING GERMANIUM, AND SUBSTRATE HAVING THIN CRYSTALLIZED GERMANIUM LAYER

(75) Inventor: Michael G. Mauk, Greenville, DE (US)

(73) Assignee: Heritage Power LLC, Atlanta, GA (US)

( * ) Notice: Subject to any disclaimer, the term of this patent is extended or adjusted under 35 U.S.C. 154(b) by 0 days.

(21) Appl. No.: 10/970,509

(22) Filed: Oct. 21, 2004

(65) Prior Publication Data
US 2005/0054185 A1 Mar. 10, 2005

Related U.S. Application Data

(63) Continuation of application No. PCT/US03/12335, filed on Apr. 22, 2003.

(60) Provisional application No. 60/374,656, filed on Apr. 23, 2002.

(51) Int. Cl.
*H01L 21/302* (2006.01)
*H01L 21/461* (2006.01)

(52) U.S. Cl. .................. 438/752; 438/604; 438/933; 257/E21.17; 257/E21.127; 257/E21.215

(58) Field of Classification Search .......... 438/752, 438/933, 602, 603, 680, 712, 688, 679
See application file for complete search history.

(56) References Cited

U.S. PATENT DOCUMENTS

| 4,745,449 | A |   | 5/1988 | Chang et al. |
| 5,181,087 | A |   | 1/1993 | Usagawa et al. |
| 5,234,843 | A |   | 8/1993 | Oyoshi et al. |
| 5,426,532 | A | * | 6/1995 | Costich ............ 359/586 |
| 5,462,883 | A | * | 10/1995 | Dennard et al. ......... 438/459 |
| 6,209,352 | B1 | * | 4/2001 | Beall et al. ............ 65/30.1 |
| 6,874,335 | B2 | * | 4/2005 | Uhlenbrock .......... 65/29.19 |

FOREIGN PATENT DOCUMENTS

| JP | 55-117236 | 9/1980 |
| JP | 6-171236 | 6/1994 |

* cited by examiner

*Primary Examiner*—David Nhu
(74) *Attorney, Agent, or Firm*—Burr & Brown

(57) ABSTRACT

A structure including at least one layer of germanium formed on a surface of a ceramic substrate is provided. The layer of germanium has a thickness of not larger than 10 microns and includes grains having grain size of at least 0.05 mm. A structure including at least one layer of germanium formed on a surface of a ceramic substrate and having at least one capping layer formed on a surface of the layer of germanium is also provided. In addition, a method of forming a thin film germanium structure is provided including forming at least one layer of germanium on a surface of a ceramic substrate, then forming at least one capping layer on a surface of the layer of germanium, followed by heating and then cooling the layer of germanium.

11 Claims, 1 Drawing Sheet

Figure 1:
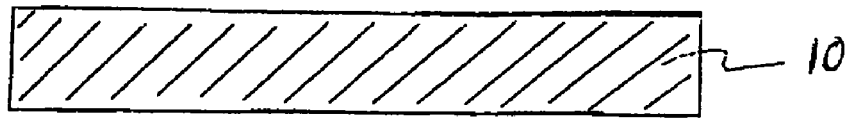

CAPPING LAYER FOR CRYSTALLIZING GERMANIUM, AND SUBSTRATE HAVING THIN CRYSTALLIZED GERMANIUM LAYER

CROSS-REFERENCE TO RELATED APPLICATIONS

This application is a continuation of PCT application PCT/US03/12335, filed Apr. 22, 2003, the entirety of which is incorporated herein by reference.

This application claims the benefit of U.S. Provisional Patent Application No. 60/374,656, filed Apr. 23, 2002, the entirety of which is incorporated herein by reference.

FIELD OF THE INVENTION

The present invention is directed to a method for crystallizing germanium. In a specific aspect, the present invention is directed to a method for recrystallizing a thin film of germanium formed on a ceramic or other non-germanium substrate.

The present invention is also directed to a ceramic substrate with a thin germanium layer formed thereon, the thin germanium layer having large grain size, and especially grain sizes sufficiently large to support efficient semiconductor device performance.

BACKGROUND OF THE INVENTION

Crystalline germanium is a very useful material for a variety of purposes. For example, crystalline germanium wafers are extremely useful in the manufacture of a variety of semiconductor devices. Among a number of well known properties, crystalline germanium is substantially lattice matched to many materials employed in the semiconductor industry, e.g., gallium arsenide. Germanium wafers offer many significant benefits when used as substrates in manufacturing solar-electric cells.

However, germanium is a relatively scarce element. As a result, the current relatively high cost of germanium has had the effect of limiting the cost-effectiveness of using germanium, and has thereby had the effect of preventing its use in a wide variety of technical scenarios where its use would otherwise be embraced.

SUMMARY OF THE INVENTION

The present invention is directed to a method which provides crystalline germanium in a structure in which the favorable aspects of germanium can be realized at a comparatively lower cost.

In accordance with the present invention, it has been recognized that in many technical applications, significant benefits provided by the use of germanium relate to providing a seeding surface on which other crystalline structures can be grown. However, substrates on which crystalline structures are grown typically have thicknesses which are much larger than the depth involved in providing seeding for a structure to be grown. For example, a substrate used to provide a seeding surface may have a thickness of about 500 micrometers or more, but the region which actually directly affects the crystal growth of the grown structure (i.e., the seeding) is only a very thin portion of the substrate adjacent the surface of the substrate on which the structure is grown.

The present invention provides a reduced cost substrate to replace more expensive germanium wafers, the substrate comprising a ceramic substrate having a thin layer of germanium on a surface thereof. However, if a thin layer of germanium is merely deposited on a ceramic substrate, the germanium does not exhibit large grain size crystalline structure, because ceramics each have a crystal structure (e.g., polycrystalline structure) which is significantly different from single crystal germanium, and so the germanium cannot be grown epitaxially on the ceramic. More specifically, deposition of germanium on dissimilar substrates such as ceramics, quartz, glass, metals, etc. results in a polycrystalline film with lateral grain dimensions in the range of 1 to 100 microns. Such microstructures render the Germanium layer useless for almost all electronic and optoelectronic applications.

In accordance with the present invention, it has been found that by forming a thin layer of germanium on a ceramic substrate, then forming a capping layer over the thin layer of germanium, then heating to melt the thin layer of germanium, and then slowly cooling the germanium to recrystallize the germanium, there is formed a recrystallized thin layer of germanium which exhibits large, highly oriented grains. The present invention is directed to such a process, and to the structures obtained thereby.

The invention may be more fully understood with reference to the accompanying drawings and the following detailed description of the invention.

BRIEF DESCRIPTION OF THE DRAWING FIGURES

FIGS. 1–4 depict articles formed during the course of carrying out one embodiment of a method of forming a thin film of recrystallized germanium on a surface of a substrate in accordance with the present invention.

DETAILED DESCRIPTION OF THE INVENTION

As mentioned above, according to the present invention, a thin layer of germanium is formed on a ceramic substrate. The ceramic substrate can be made of any suitable ceramic material or materials. Preferably, the ceramic substrate is made of a material (or materials) which can withstand at least about 1000° C. Preferably, the ceramic substrate is formed of ceramic material (or ceramic materials) which has thermal expansion properties which are similar to or substantially similar to those of the thin germanium layer. For example, a suitable substrate can be made of aluminum oxide, or ceramics based on mixtures of oxides, nitrides, etc., a variety of which are well known to those of skill in the art. The substrate can have any desired thickness, e.g., at least about 100 micrometers, preferably at least about 500 micrometers for structural integrity and ease of handling, although the thickness of the substrate is not essential to the success of the method.

The thin layer of germanium can be formed using any suitable deposition method. For example, the thin layer of germanium can be formed by electron-beam evaporation, thermal evaporation, plasma-enhanced chemical vapor deposition, chemical vapor deposition, CSVT (close-spaced vapor transport), molecular beam deposition, electroplating, melt coating, or sputtering. The thickness of the thin layer of germanium is preferably within the range of from a fraction of a micron to several tens of microns, e.g., about 2 to about 5 microns.

As mentioned above, a capping layer is then formed over the thin layer of germanium. The capping layer preferably has a thickness of 2,000 to 10,000 angstroms. The capping layer prevents the germanium film from agglomerating during recrystallization (or minimizes the extent to which the germanium film agglomerates and dewets the substrates). The capping layer promotes growth of large, highly oriented Ge grains during recrystallization. For example, recrystallized layers having grains of a size of at least 0.05 mm, and as large as 1 cm (or larger) can be obtained.

Preferably, the capping layer is made of metal. A particularly preferred capping layer is made of aluminum.

As mentioned above, after the capping layer has been formed on the thin layer of germanium, the germanium is then melted, and then the germanium is cooled to recrystallize it. In a representative thermal treatment, the germanium is heated to a temperature in the range of from about 600° C. to about 900° C. and is then held at that temperature for about 20 seconds to about 5 minutes, preferably about 1 minute, and then cooled at a rate of about 1° C. per minute, back to about ambient temperature. In accordance with the present invention, "cooling" encompasses actively cooling (e.g., by subjecting to temperatures lower than ambient) as well as allowing the germanium to cool under ambient or higher temperatures.

After the recrystallization of the germanium, the capping layer is preferably removed. The removal of the capping layer can be achieved by any suitable technique. For example, where the capping layer is made of aluminum, it can be stripped by (1) hydrochloric acid, (2) a mixture of hydrochloric acid and nitric acid, or (3) a tungsten etch, e.g., comprising 34 g of $KH_3PO_4$, 13.4 g of KOH, 33 g of $K_3Fe(CN)_6$ and $H_2O$ (enough to make 1 liter).

FIGS. 1–4 depict articles formed during the course of carrying out one embodiment of a method of forming a thin film of recrystallized germanium on a surface of a substrate in accordance with the present invention.

Figure 2:
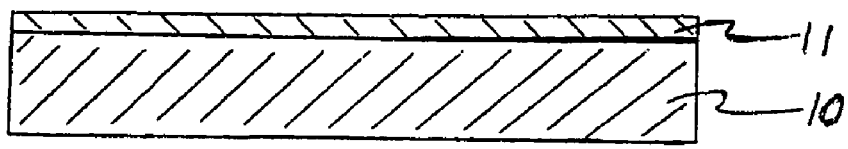
Figure 3:
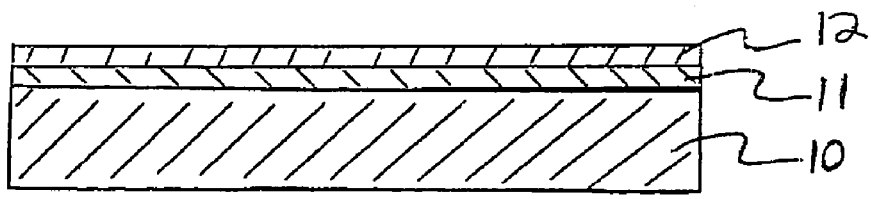
Figure 4:
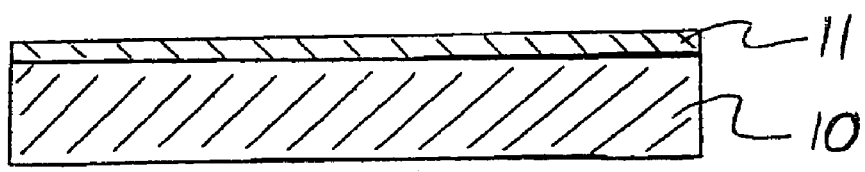

FIG. 1 depicts a ceramic substrate. FIG. 2 depicts an article including the ceramic substrate 10 and a thin layer of germanium 11 formed on a surface of the ceramic substrate 10. FIG. 3 depicts an article including the ceramic substrate 10, the thin layer of germanium 11, and a capping layer 12 formed on a surface of the thin layer of germanium 11. FIG. 4 depicts an article including the ceramic substrate 10, and the thin layer of germanium 11, after the thin layer of germanium has been recrystallized and the capping layer 12 has been removed.

The present invention makes it possible to provide a structure comprising a ceramic substrate and a layer of germanium, the layer of germanium having a thickness of not larger than 10 microns, the layer of germanium including a plurality of grains having grain size of at least 0.05 mm (or even at least 1 mm). The present invention is further directed to a structure comprising a ceramic substrate, a layer of germanium, and a capping layer.

The invention claimed is:

1. A method of forming a thin film germanium structure, comprising:
   forming at least one layer of germanium on a surface of a ceramic substrate;
   forming at least one capping layer on a surface of said layer of germanium;
   heating said layer of germanium to a temperature of at least about 600° C. after forming said at least one capping layer thereon; and
   cooling said layer of germanium after said heating of said layer of germanium.

2. A method of forming a thin film germanium structure as recited in claim 1, wherein said heating of said layer of germanium heats said layer of germanium to a temperature of about 600° C. to about 900° C.

3. A method of forming a thin film germanium structure as recited in claim 1, further comprising removing said capping layer after said cooling of said layer of germanium.

4. A method of forming a thin film germanium structure as recited in claim 1, wherein said capping layer comprises at least one metal.

5. A method of forming a thin film germanium structure as recited in claim 1, wherein said capping layer comprises aluminum.

6. A method of forming a thin film germanium structure as recited in claim 1, wherein said layer of germanium has a thickness of not larger than 10 microns.

7. A method of forming a thin film germanium structure as recited in claim 1, wherein after said cooling, said layer of germanium has a plurality of grains having grain size of at least 0.05 mm.

8. A method of forming a thin film germanium structure as recited in claim 1, wherein after said cooling, said layer of germanium has a plurality of grains having grain size of at least 1 mm.

9. A method of forming a thin film germanium structure as recited in claim 1, wherein said capping layer has a thickness in the range of from about 2,000 angstroms to about 10,000 angstroms.

10. A method of forming a thin film germanium structure as recited in claim 1, wherein said layer of germanium is formed by at least one technique selected from the group consisting of electron-beam evaporation, thermal evaporation, plasma-enhanced chemical vapor deposition, chemical vapor deposition, molecular beam deposition, electroplating, melt coating, and sputtering.

11. A method of forming a thin film germanium structure as recited in claim 1, wherein said layer of germanium is cooled at a rate of about 1° C. per minute during said cooling of said layer of germanium.

* * * * *